(12) United States Patent
Kim et al.

(10) Patent No.: US 10,790,255 B2
(45) Date of Patent: Sep. 29, 2020

(54) FAN-OUT SEMICONDUCTOR PACKAGE

(71) Applicant: SAMSUNG ELECTRONICS CO., LTD., Suwon-si (KR)

(72) Inventors: Woon Chun Kim, Suwon-si (KR); Jun Heyoung Park, Suwon-si (KR); Ji Hye Shim, Suwon-si (KR); Sung Keun Park, Suwon-si (KR); Gun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/291,621

(22) Filed: Mar. 4, 2019

(65) Prior Publication Data

US 2020/0105703 A1    Apr. 2, 2020

(30) Foreign Application Priority Data

Sep. 27, 2018  (KR) .................. 10-2018-0114841

(51) Int. Cl.
| | |
|---|---|
| *H01L 23/00* | (2006.01) |
| *H01L 23/498* | (2006.01) |
| *H01L 23/13* | (2006.01) |
| *H01L 23/31* | (2006.01) |
| *H01L 21/683* | (2006.01) |
| *H01L 21/48* | (2006.01) |
| *H01L 21/56* | (2006.01) |

(52) U.S. Cl.
CPC .......... *H01L 24/20* (2013.01); *H01L 21/4846* (2013.01); *H01L 21/568* (2013.01); *H01L 21/6836* (2013.01); *H01L 23/13* (2013.01); *H01L 23/3128* (2013.01); *H01L 23/3135* (2013.01); *H01L 23/49816* (2013.01); *H01L 23/49822* (2013.01); *H01L 23/49838* (2013.01); *H01L 24/05* (2013.01); *H01L 2224/211* (2013.01)

(58) Field of Classification Search
None
See application file for complete search history.

(56) References Cited

FOREIGN PATENT DOCUMENTS

| JP | 2001-274034 A | 5/2006 |
|---|---|---|
| JP | 5901991 A | 3/2016 |

*Primary Examiner* — Long Pham
(74) *Attorney, Agent, or Firm* — Sughrue Mion, PLLC

(57) ABSTRACT

A fan-out semiconductor package includes a frame comprising a plurality of wiring layers electrically connected to one another, and having a recessed portion having a stopper layer 112aM disposed on a bottom surface of the recessed portion, and a through-hole penetrating through the stopper layer; a semiconductor chip having an active surface on which a connection pad is disposed and an inactive surface opposing the active surface, and disposed in the recessed portion such that the inactive surface opposes the stopper layer; an encapsulant covering at least portions of the frame and the inactive surface of the semiconductor chip, and filling at least a portion of the recessed portion; and an interconnect structure disposed on the frame and the active surface of the semiconductor chip, and comprising a redistribution layer electrically connected to the plurality of wiring layers and the connection pad.

17 Claims, 19 Drawing Sheets

FAN-OUT SEMICONDUCTOR PACKAGE

CROSS-REFERENCE TO RELATED APPLICATION(S)

This application claims benefit of priority to Korean Patent Application No. 10-2018-0114841 filed on Sep. 27, 2018 in the Korean Intellectual Property Office, the disclosure of which is incorporated herein by reference in its entirety.

TECHNICAL FIELD

The present disclosure relates to a semiconductor package, and more particularly, a fan-out semiconductor package in which an electrical interconnect metal may extend outwardly of a region in which a semiconductor chip is disposed.

BACKGROUND

One of major trends in semiconductor chip technology is to reduce the size of components. Accordingly, in the field of semiconductor packages, a semiconductor package has been required to have a reduced size while implementing a plurality of pins in accordance with an increase in consumption of small-sized semiconductor chips.

Among semiconductor package techniques to meet the above demand is a fan-out semiconductor package. In the fan-out semiconductor package, a connection terminal is redistributed externally of a region in which a semiconductor chip is disposed, such that a semiconductor may have a reduced size while implementing a plurality of pins.

SUMMARY

An aspect of the present disclosure is to provide a fan-out semiconductor package in which a semiconductor chip may be disposed using a frame including a recessed portion having a blind form such that a process of forming a metal post and a process of grinding a metal post may be omitted.

Another aspect of the present disclosure is to provide a fan-out semiconductor package in which one or more through-holes penetrating through a stopper layer may be formed in a lower portion of a recessed portion of a frame such that an encapsulant may fill the recessed portion through the through-hole and encapsulate a semiconductor chip.

According to an aspect of the present disclosure, a fan-out semiconductor package includes a frame comprising a plurality of wiring layers electrically connected to one another, and having a recessed portion having a stopper layer disposed on a bottom surface of the recessed portion, and a through-hole penetrating through the stopper layer; a semiconductor chip having an active surface on which a connection pad is disposed and an inactive surface opposing the active surface, and disposed in the recessed portion such that the inactive surface opposes the stopper layer; an encapsulant covering at least portions of the frame and the inactive surface of the semiconductor chip, and filling at least a portion of the recessed portion; and an interconnect structure disposed on the frame and the active surface of the semiconductor chip, and comprising a redistribution layer electrically connected to the plurality of wiring layers and the connection pad.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
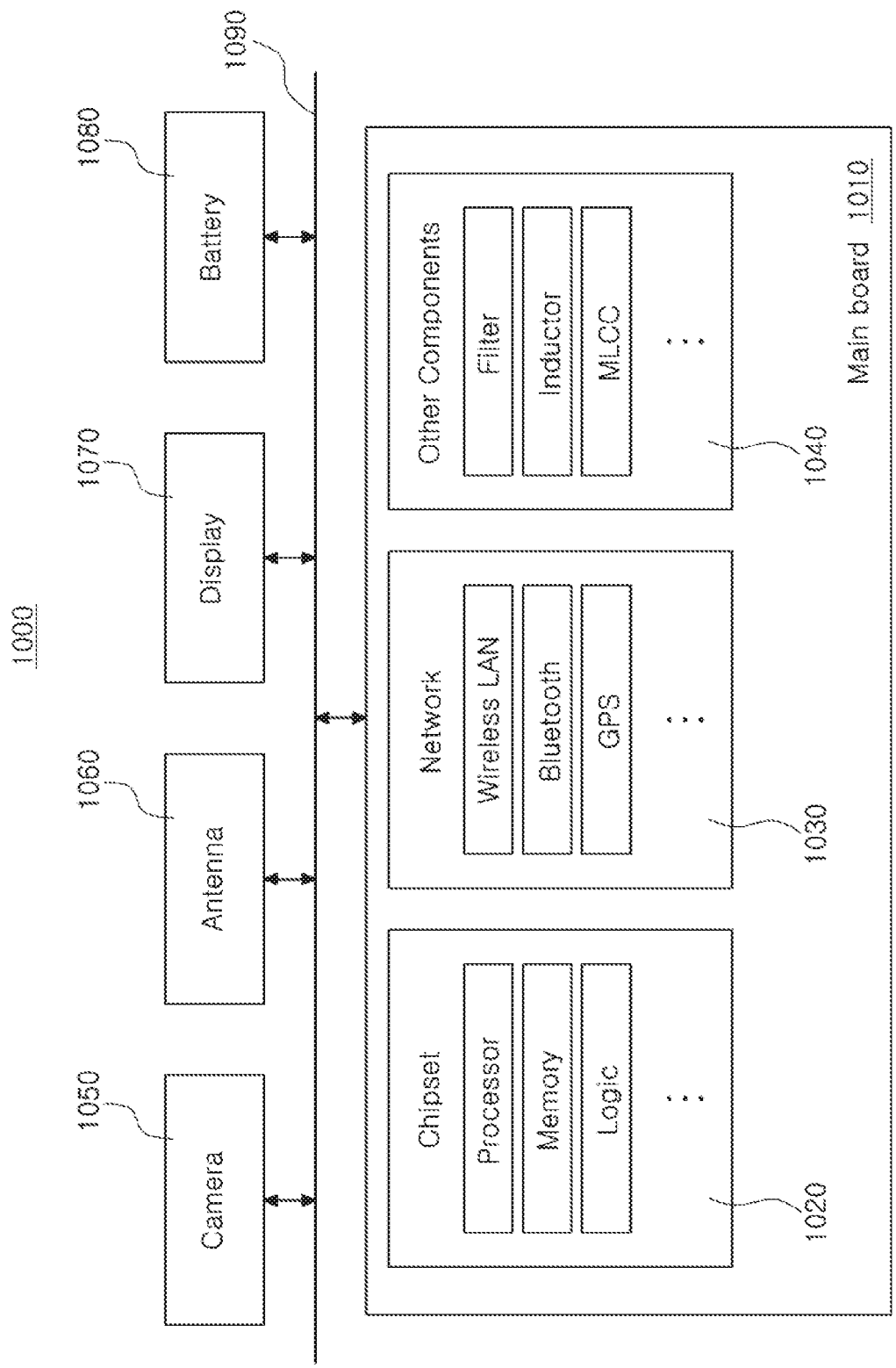
FIG. 1 is a schematic block diagram illustrating an example of an electronic device system.

Hereinafter, exemplary embodiments of the present disclosure will be described with reference to the accompanying drawings.

In the drawings, shapes, sizes, and the like, of elements may be exaggerated or briefly illustrated for clarity of description.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
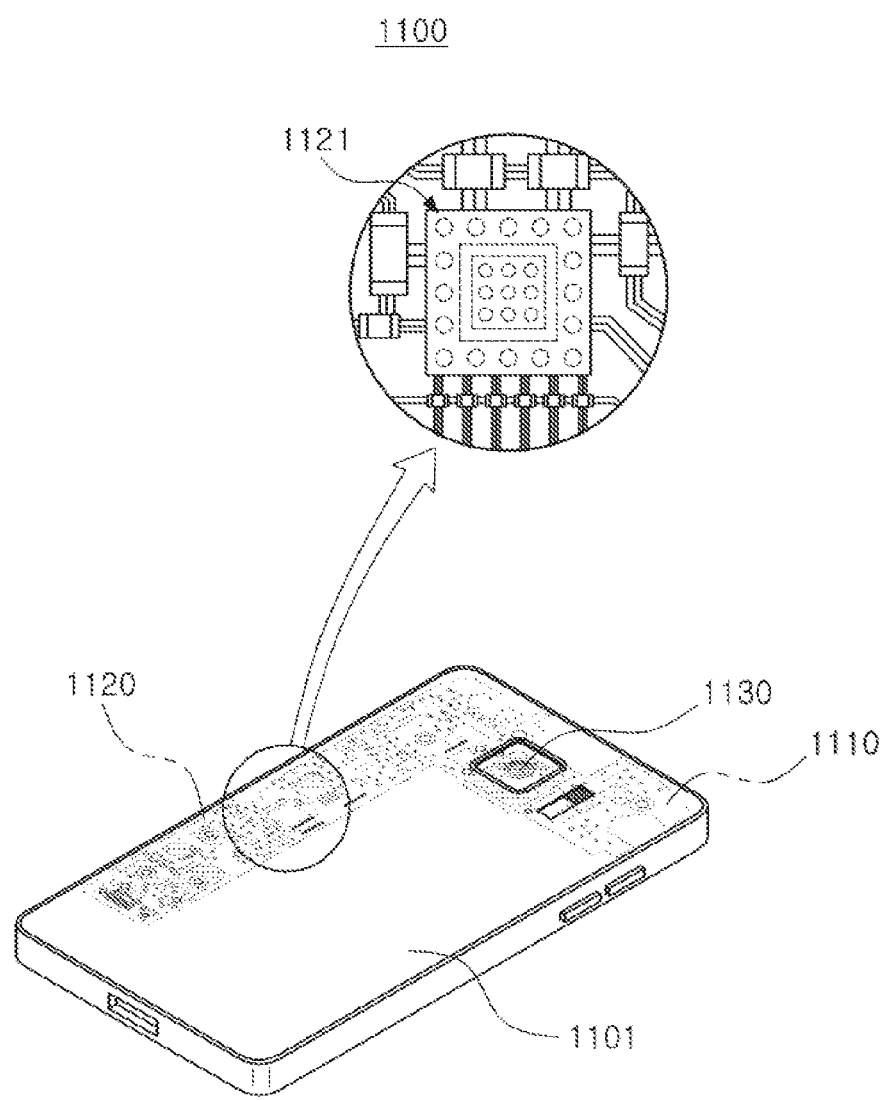
FIG. 2 is a schematic perspective diagram illustrating an example of an electronic device.

FIG. 2 is a schematic perspective diagram illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will be described in greater detail with reference to the drawings.

Fan-in Semiconductor Package

Figure 3A:
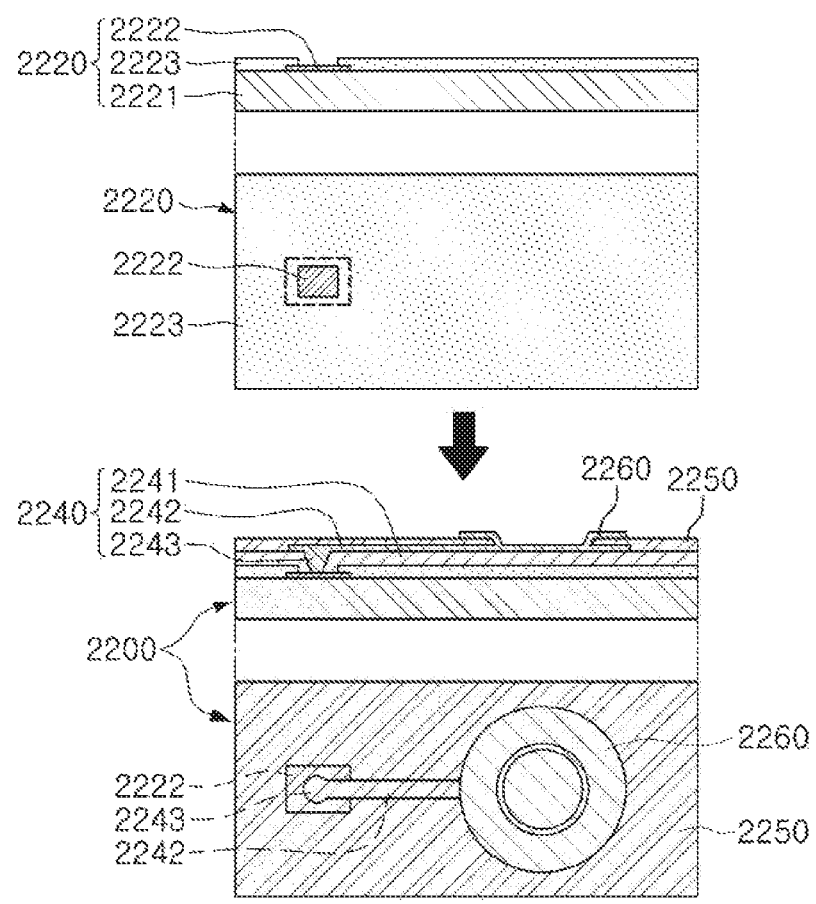
FIGS. 3A and 3B are schematic cross-sectional diagrams illustrating states of a fan-in semiconductor package before and after a packaging process.
Figure 3B:
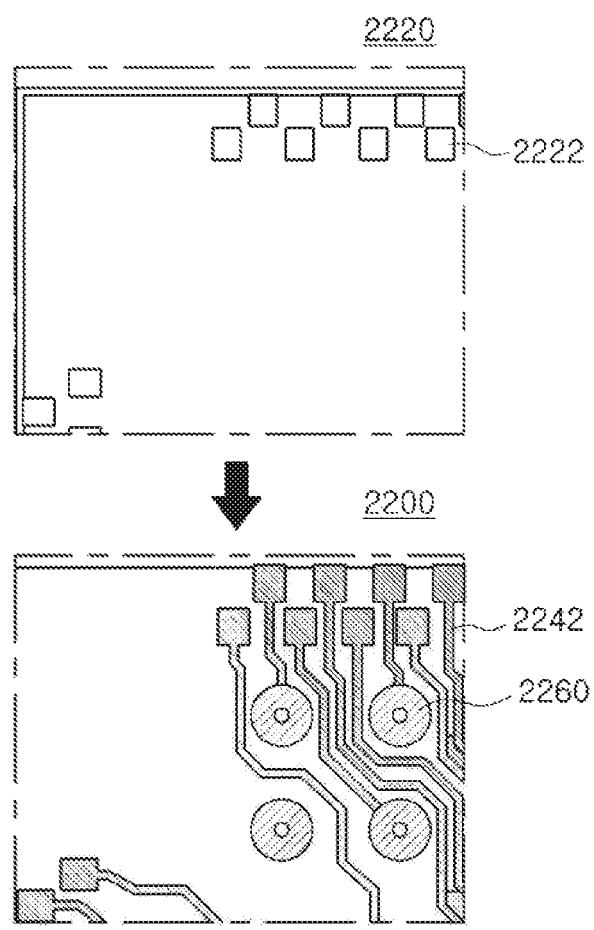

FIGS. 3A and 3B are schematic cross-sectional diagrams illustrating states of a fan-in semiconductor package before and after a packaging process.

Figure 4:
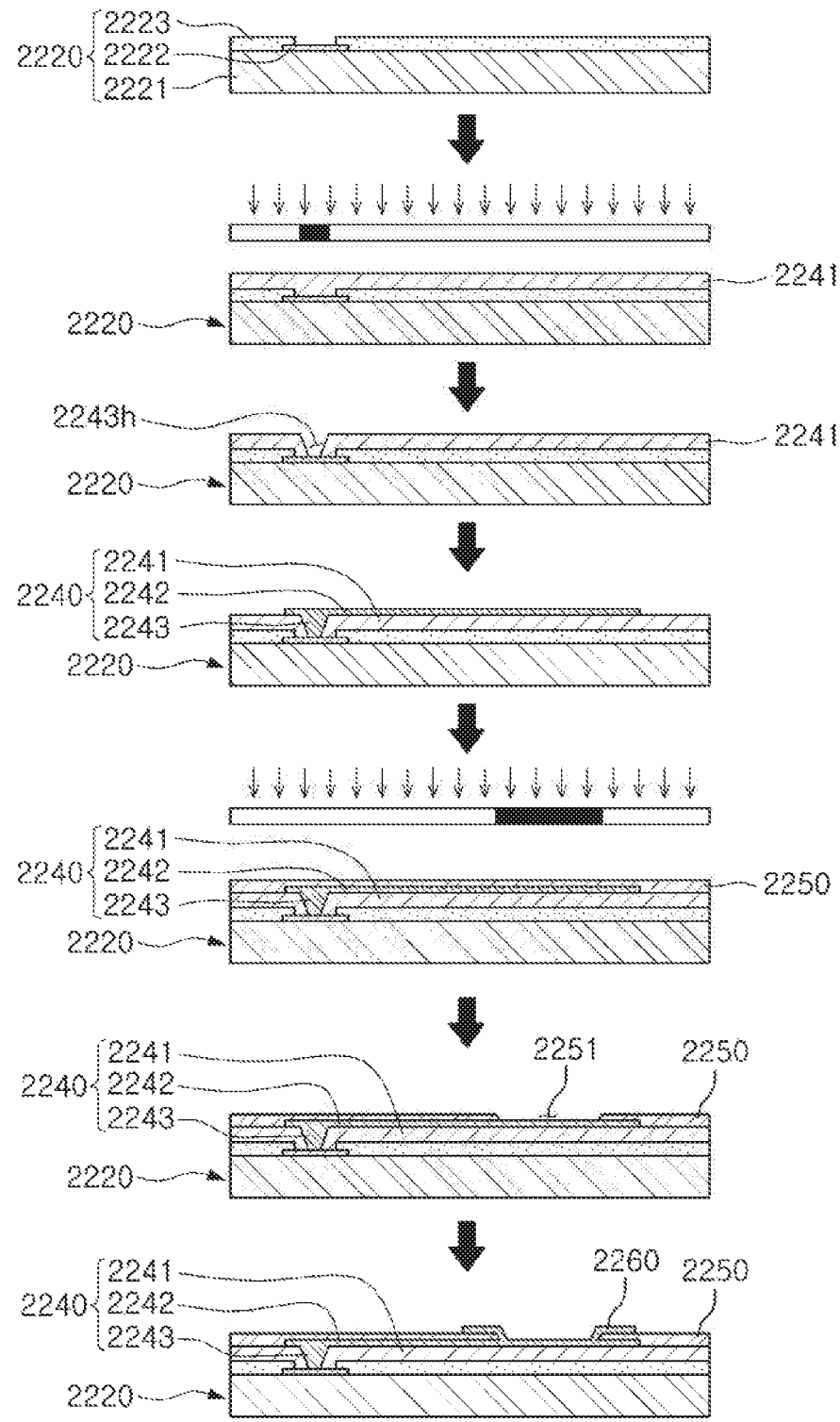
FIG. 4 is a schematic cross-sectional diagram illustrating a process of packaging a fan-in semiconductor package.

FIG. 4 is a schematic cross-sectional diagram illustrating a process of packaging a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
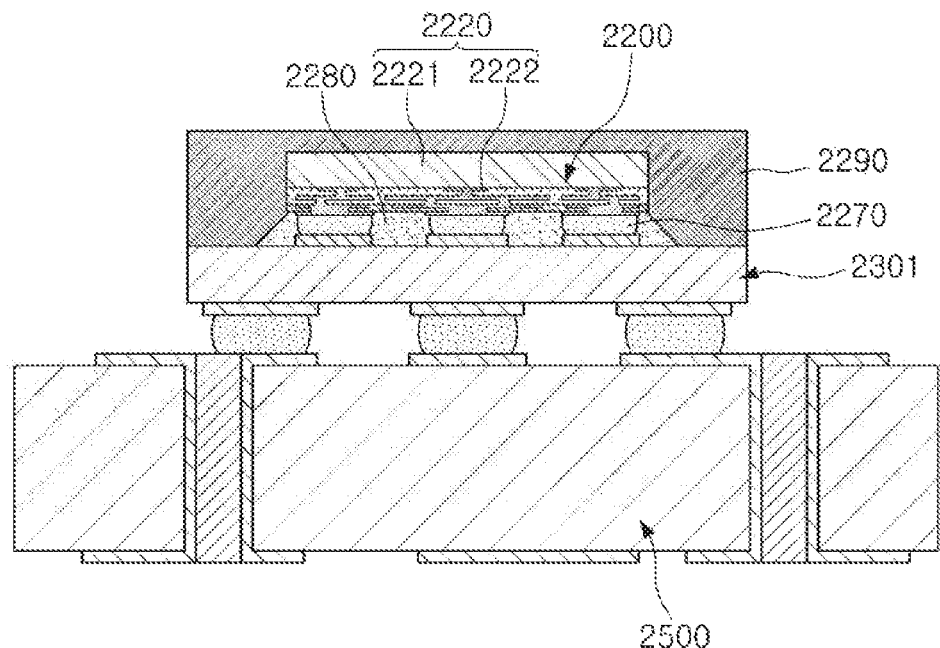
FIG. 5 is a schematic cross-sectional diagram illustrating an example in which a fan-in semiconductor package is mounted on a BGA substrate and mounted on a mainboard of an electronic device.
Figure 6:
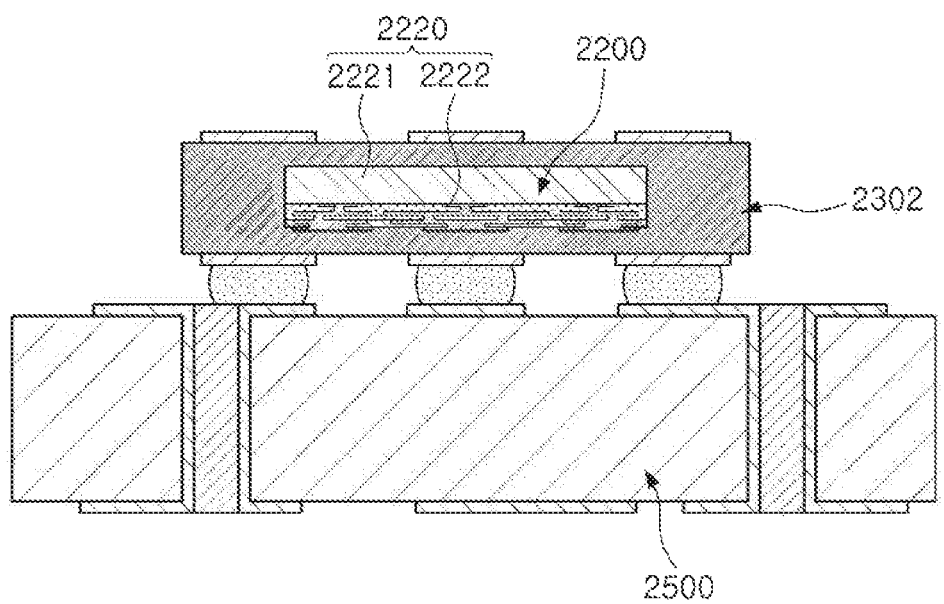
FIG. 6 is a schematic cross-sectional diagram illustrating an example in which a fan-in semiconductor package is embedded in a ball grid array (BGA) substrate and mounted on a mainboard of an electronic device.

FIG. 5 is a schematic cross-sectional diagram illustrating an example in which a fan-in semiconductor package is mounted on a ball grid array (BGA) substrate and mounted on a mainboard of an electronic device;

FIG. 6 is a schematic cross-sectional diagram illustrating an example in which a fan-in semiconductor package is embedded in a ball grid array (BGA) substrate and mounted on a mainboard of an electronic device Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
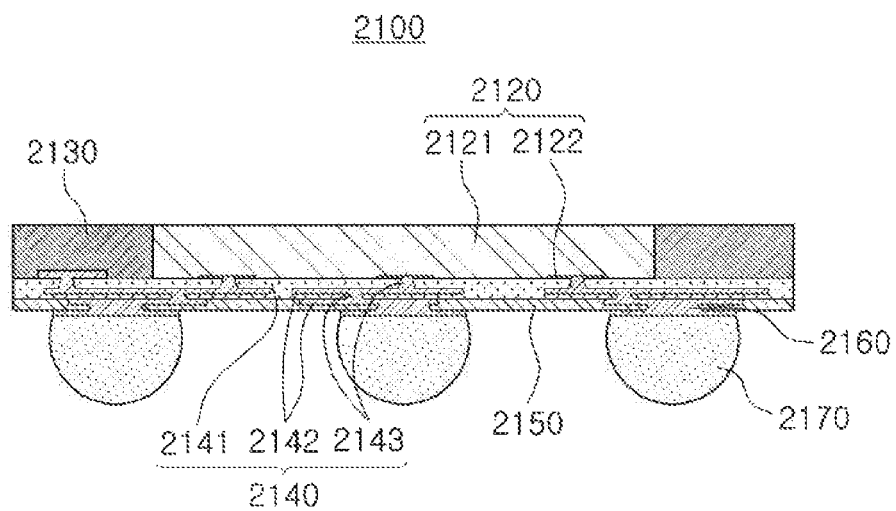
FIG. 7 is a schematic cross-sectional diagram illustrating a fan-out semiconductor package.

FIG. 7 is a schematic cross-sectional diagram illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
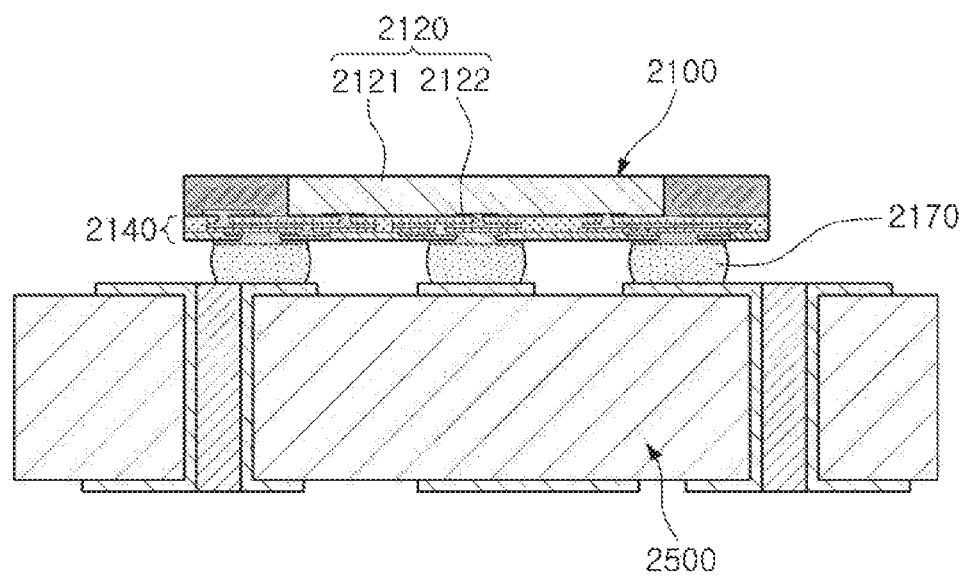
FIG. 8 is a schematic cross-sectional diagram illustrating an example in which a fan-out semiconductor package is mounted on a mainboard of an electronic device.

FIG. 8 is a schematic cross-sectional diagram illustrating an example in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

In the description below, a fan-out semiconductor package in which a semiconductor chip may be disposed using a frame including a recessed portion having a blind form such that a process of forming a metal post and a process of grinding a metal post may be omitted will be described with reference to the accompanied drawings.

Figure 9:
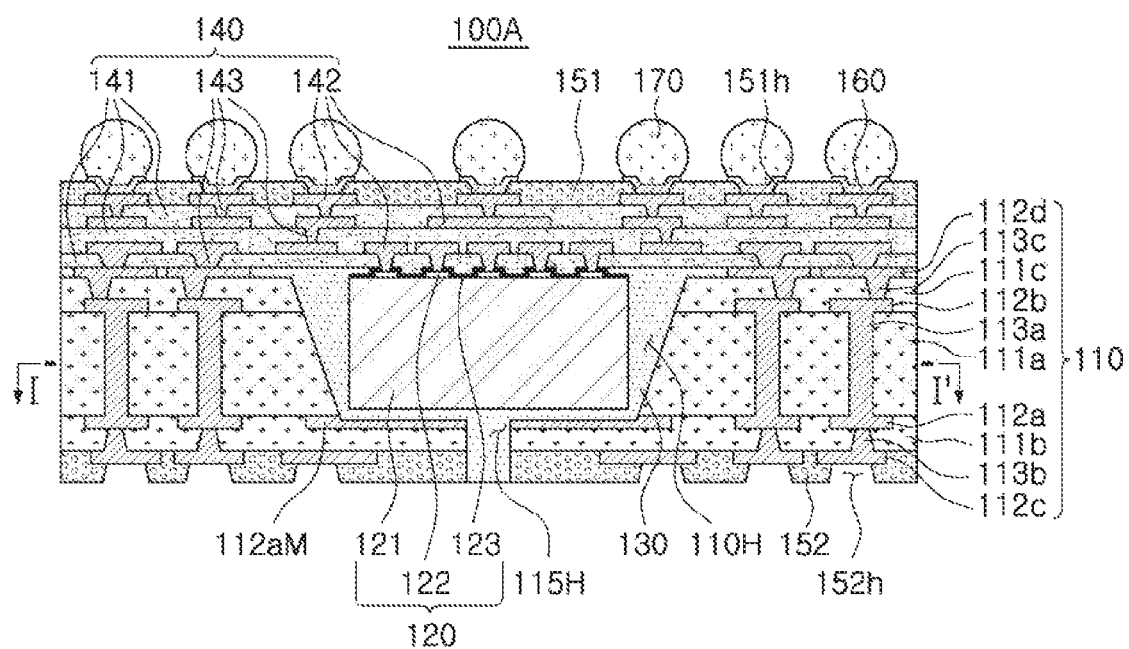
FIG. 9 is a schematic cross-sectional diagram illustrating an example of a fan-out semiconductor package.

FIG. 9 is a schematic cross-sectional diagram illustrating an example of a fan-out semiconductor package.

Figure 10:
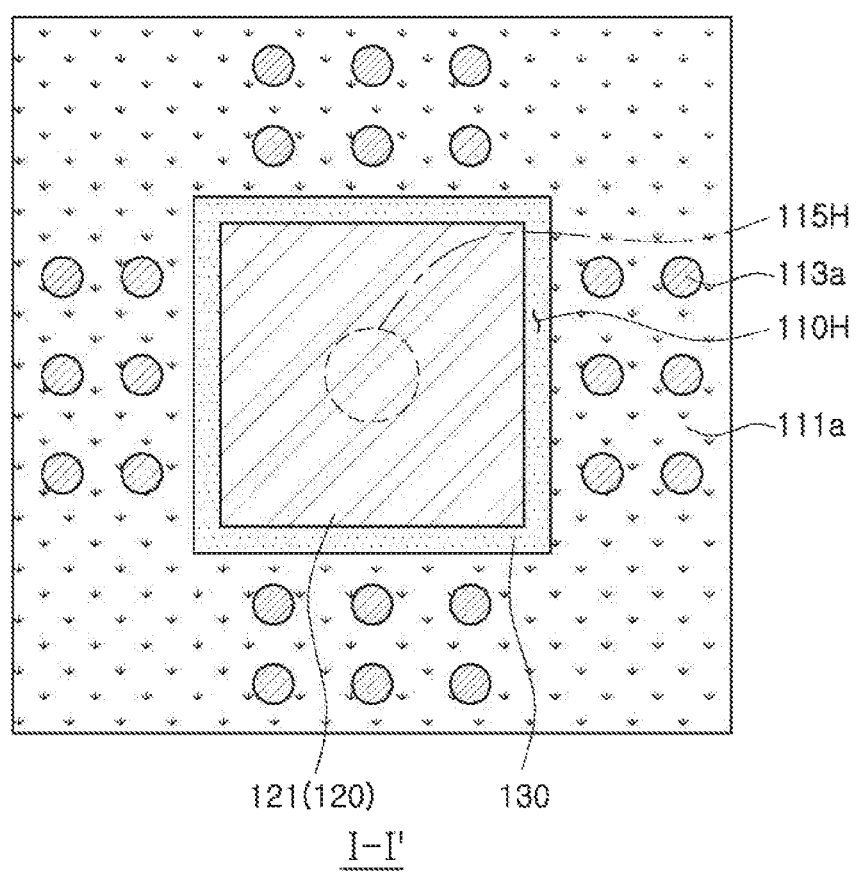
FIG. 10 is a schematic cross-sectional plan diagram illustrating a fan-out semiconductor package in FIG. 9 taken along lines I-I'.

FIG. 10 is a schematic cross-sectional plan diagram illustrating a fan-out semiconductor package in FIG. 9 taken along lines I-I'.

Referring to the diagrams, a fan-out semiconductor package 100A according to an exemplary embodiment may include a frame 110 comprising a plurality of wiring layers 112a, 112b, 112c, and 112d electrically connected to one another, and having a recessed portion 110H having a stopper layer 112aM disposed on a bottom surface of the recessed portion, and a through-hole 115H penetrating through at least the stopper layer 112aM, a semiconductor chip 120 having an active surface on which a connection pad 122 is disposed and an inactive surface opposing the active surface, and disposed in the recessed portion 110H such that the inactive surface opposes the stopper layer 112aM, an encapsulant 130 covering at least portions of the frame 110 and the inactive surface of the semiconductor chip 120, and filling at least a portion of the recessed portion 110H, and an interconnect structure 140 disposed on the frame 110 and the active surface of the semiconductor chip 120, and comprising a redistribution layer 142 electrically connected to the plurality of wiring layers 112a, 112b, 112c, and 112d and the connection pad 122. The semiconductor chip 120 may be disposed in the recessed portion 110H to be spaced apart from the stopper layer 112aM by a predetermined distance.

To employ the frame having a recessed portion having a blind form, to dispose a semiconductor chip in the recessed portion and encapsulate the semiconductor chip, and to form a connection member on the semiconductor chip, it may be necessary to form metal posts, and the like, on a connection pad of the semiconductor chip in advance. In this case, a grinding process may be necessary after encapsulating the semiconductor chip using an encapsulant. That is because it may be necessary to expose the metal posts from the encapsulant and to configure differences in heights of the metal posts to be constant. However, when a grinding process is undertaken, flatness may not be constant, and in some cases, metal burrs or foreign materials may be created, or cracks may be created in the encapsulant. Also, a gap may be created between the encapsulant and a metal pad. Further, a residual thickness of the metal post may need to be measured when a grinding process is undertaken, and to this end, a high-priced measuring device may be necessary. When a high-priced measuring device is used, if the device is not properly set, a defect may occur due to over-grinding.

In the fan-out semiconductor package 100A according to the exemplary embodiment, the through-hole 115H penetrating through at least the stopper layer 112aM may be formed in the frame 110 such that the through-hole 115H is connected to the recessed portion 110H. The through-hole 115H may also penetrate through a region covering the stopper layer 112aM of the frame 110, a built-up insulating layer 111b, for example. Thus, the encapsulant 130 may be provided through the through-hole 115H. Also, the semiconductor chip 120 may be spaced apart from the stopper layer 112aM disposed on a bottom surface of the recessed portion 110H. For example, while the active surface of the semiconductor chip 120 and the uppermost wiring layer 112d of the frame 110 are attached to a carrier, a tape, or the like, to be coplanar with each other, the encapsulant 130 may be provided through the through-hole 115H from a lower portion of the frame 110 such that, without a separate grinding process, overall surfaces on which the interconnect structure 140 is formed, an upper surface of the uppermost wiring layer 112d of the frame 110, an upper surface of the encapsulant 130, and the active surface of the semiconductor chip 120, may become coplanar with one another. Therefore, a separate process of forming a metal post, as well as a grinding process, may not be necessary. Thus, the above described issues may be resolved.

In the description below, elements included in the fan-out semiconductor package 100A according to the exemplary embodiment will be described in greater detail.

The frame 110 may improve stiffness of the fan-out semiconductor package 100A depending on a specific material of the frame 110, and may secure consistency in thickness of the encapsulant 130, and the like. Also, as the frame 110 includes the wiring layers 112a, 112b, 112c, and 112d and the connection via layers 113a, 113b, and 113c, the frame 110 may serve as upper and lower electrical interconnect structure. Further, as the frame 110 includes the third wiring layer 112c disposed in a position lower than the inactive surface of the semiconductor chip 120, a backside wiring layer for the semiconductor chip 120 may be provided without a separate process of forming a backside wiring layer. In other words, one of the wiring layers 112a, 112b, 112c, and 112d may be disposed in a position lower than the stopper layer 112aM.

The frame 110 may have the recessed portion 110H having a blind form, which may be formed by using the stopper layer 112aM as a stopper. The semiconductor chip 120 may be disposed on the stopper layer 112aM such that the inactive surface is spaced apart from the stopper layer 112aM, and may be fixed by the encapsulant 130. The recessed portion 110H may be formed by a sand blast process, which will be described later, and in this case, a cross-section of the recessed portion 110H may have a tapered shape. In other words, a wall of the recessed portion 110H may have a predetermined slope with reference to the stopper layer 112aM. In this case, a process of aligning the semiconductor chips 120 may be further simplified, which may increase a yield.

The frame 110 may include the stopper layer 112aM and the through-hole 115H penetrating through the built-up insulating layer 111b which covers the stopper layer 112aM. In the exemplary embodiment, the through-hole 115H may be filled with the encapsulant 130. The through-hole 115H may be connected to the recessed portion 110H, and thus, the encapsulant 130 may be employed through the through-hole 115H. In the diagrams, only one through-hole 115H is illustrated for ease of description, but an exemplary embodiment thereof is not limited thereto. If desired, a plurality of through-holes 115H may be provided. Also, the through-hole 115H may be implemented to have a variety of shapes other than a circular shape.

The frame 110 may include a core insulating layer 111a, a first wiring layer 112a and a second wiring layer 112b respectively disposed on a lower surface and an upper surface of the core insulating layer 111a, a first built-up insulating layer 111b disposed in a lower portion of the core insulating layer 111a and covering the first wiring layer 112a, a third wiring layer 112c disposed on the first built-up insulating layer 111b, a second built-up insulating layer 111c disposed in an upper portion of the core insulating layer 111a and covering the second wiring layer 112b, and a fourth wiring layer 112d disposed on the second built-up insulating layer 111c. The frame 110 may further include a first connection via layer 113a penetrating through the core insulating layer 111a and electrically connecting the first and second wiring layers 112a and 112b to each other, a second connection via layer 113b penetrating through the first built-up insulating layer 111b and electrically connecting the first and third wiring layers 112a and 112c to each other, and a third connection via layer 113c penetrating through the second built-up insulating layer 111c and electrically connecting the second and fourth wiring layers 112b and 112d to each other.

The first to fourth wiring layers 112a, 112b, 112c, and 112d in the frame 110 may be electrically connected to one another, and may be electrically connected to the connection pads 122, respectively, through the redistribution layer 142 of the interconnect structure 140. The recessed portion 110H may penetrate through the core insulating layer 111a and the second built-up insulating layer 111c, but may not penetrate through the first built-up insulating layer 111b. The through-hole 115H, however, may penetrate through the first built-up insulating layer 111b and the stopper layer 112aM and may be connected to the recessed portion 110H. The stopper layer 112aM may be disposed on a lower surface of the core insulating layer 111a and may be covered by the first built-up insulating layer 111b. The first built-up insulating layer 111b, the second built-up insulating layer 111c, the wiring layers 112c and 112d and the connection via layers 113b and 113c formed on the first built-up insulating layer 111b and the second built-up insulating layer 111c may have a greater number of layers than the number of layers illustrated in the diagrams, and may have symmetrical forms with reference to the core insulating layer 111a.

The stopper layer 112aM may be a metal layer including a metal such as copper (Cu), and the like. Alternatively, the stopper layer 112aM may include a material having a lower etch rate in a sand blast process than an etch rate of a metal. For example, a dry film photoresist may be used as the stopper layer 112aM. When the stopper layer 112aM is a metal layer, the stopper layer 112aM may be used as a ground, and in this case, the stopper layer 112aM may be electrically connected to a ground of at least one of the wiring layers 112a, 112b, 112c, and 112d. A lower surface of the stopper layer 112aM may be covered by the first built-up insulating layer 111b, and at least a portion of an upper surface may be opened by the recessed portion 110H. The stopper layer 112aM may be configured such that a thickness of a region opened from the core insulating layer 111a by the recessed portion 110H may be less than a thickness of an edge region which is not opened from the core insulating layer 111a by the recessed portion 110H. That is because the opened portion may be partially removed during a sand blast process.

As materials of the insulating layers 111a, 111b, and 111c, an insulating material may be used. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), such as prepreg, ajinomoto build-up film (ABF), FR-4, bismaleimide triazine (BT), or the like, for example. When a material having high stiffness such as prepreg including glass fiber, and the like, is used, the frame 110 may be used as a support member for controlling warpage of the package 100A.

The core insulating layer 111a may have a thickness greater than thicknesses of the first built-up insulating layer 111b and the second built-up insulating layer 111c. The core insulating layer 111a may have a relatively great thickness to maintain stiffness, and the first built-up insulating layer 111b and the second built-up insulating layer 111c may be employed to form a greater number of the wiring layers 112c and 112d. The core insulating layer 111a may include an insulating material different from the materials of the first built-up insulating layer 111b and the second built-up insulating layer 111c. For example, the core insulating layer 111a may be employed using a copper clad laminate (CCL) film having a relatively great thickness, and the first built-up insulating layer 111b and the second built-up insulating layer 111c may be employed using prepreg or ABF having a relatively low thickness, but exemplary embodiments thereof are not limited thereto. Similarly, the first connection via layer 113a penetrating through the core insulating layer 111a may have a diameter greater than diameters of the second and third connection via layers 113b and 113c penetrating through the first and second built-up insulating layers 111b and 111c.

The wiring layers 112a, 112b, 112c, and 112d may redistribute the connection pads 122 of the semiconductor chip 120 along with the redistribution layers 142. Materials of the wiring layers 112a, 112b, 112c, and 112d may be a metal material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform a variety of functions depending on designs of the respective layers. For example, the wiring layers 112a, 112b, 112c, and 112d may include a ground (GND) pattern, a power (PWR) pattern, a signal (S) pattern, and the like. The signal (S) pattern may include various signal other than a ground (GND) pattern, a power (PWR) pattern, and the like, such as a data signal, for example. The wiring layers 112a, 112b, 112c, and 112d may also include various pad patterns.

The wiring layers 112a, 112b, 112c, and 112d may have thicknesses greater than thicknesses of the redistribution layers 142 of the connection member 140. The frame 110 may have a thickness greater than a thickness of the semiconductor chip 120, and thus, the wiring layers 112a, 112b, 112c, and 112d may have greater sizes. The redistribution layers 142 of the connection member 140 may have relatively smaller sizes to reduce thicknesses of the redistribution layers 142.

The connection via layers 113a, 113b, and 113c may electrically connect the wiring layers 112a, 112b, 112c, and 112d formed in different layers, and may accordingly form an electrical path in the frame 110. As materials of the connection via layers 113a, 113b, and 113c, a metal material may be used. The connection via layers 113a, 113b, and 113c may also be formed of a metal material. The connection via layers 113a, 113b, and 113c may be charged with a metal material, or a metal material may be formed along a wall of a via hole. The first connection via layer 113a may have a cross-section having a cylindrical shape or having a shape of a cross-section of an hourglass. The second and third connection via layers 113b and 113c may have cross-sections having tapered shapes tapered in opposing directions with reference to the core insulating layer 111a.

The semiconductor chip 120 may be an integrated circuit (IC) in which several hundreds to several millions of devices are integrated in one chip. The semiconductor chip 120 may be, for example, a processor chip such as a central processor (e.g., CPU), a graphics processor (e.g., GPU), a field programmable gate array (FPGA), a digital signal processor, a cryptographic processor, a microprocessor, a micro controller, or the like, specifically an application processor (AP), for example, but an example of the semiconductor chip 120 is not limited thereto. The semiconductor chip 120 may be a memory such as other types of volatile memory (e.g., DRAM), a non-volatile memory (e.g. ROM), a flash memory, or the like, or may be an analog-digital converter or a logic such as an application-specific IC (ASIC).

The semiconductor chip 120 may be formed based on an active wafer. A base material of a body 121 may be silicon (Si), germanium (Ge), gallium arsenide (GaAs), or the like. Various circuits may be formed on the body 121. The connection pad 122 disposed on the active surface of the body 121 may electrically connect the semiconductor chip 120 to other components, and may be formed of a metal material such as aluminum (Al), copper (Cu), and the like, without being limited thereto. A passivation film 123 opening the connection pad 122, such as an oxide layer, a nitride layer, or the like, may be formed on an active surface the body 121, and the passivation film 123 may be a double layer formed of an oxide layer and a nitride layer. The passivation film 123 may have an opening (not illustrated) configured to open at least a portion of the connection pad 122. An insulation film (not illustrated) may be further disposed in other positions if desired. The semiconductor chip 120 may be a bare die, or may be a packaged die on which an insulating layer (not illustrated), a redistribution layer (not illustrated), and a bump (not illustrated), and the like, are formed on the active surface of the semiconductor chip 120.

In the semiconductor chip 120, a surface on which the connection pad 122 is disposed may be an active surface, and the opposite surface may be the inactive surface. For example, when the semiconductor chip 120 has a bare die form, a surface of the passivation film 123 may be an active surface, and a surface of the body 121 opposing to the surface on which the passivation film 123 is formed may be an inactive surface. In this case, when a position relationship between the active surface of the semiconductor chip 120 and other elements is determined, the position relationship may be determined with reference to an uppermost surface of a region covering the connection pad 122 of the passivation film 123.

The encapsulant 130 may cover at least portions of the frame 110 and the inactive surface of the semiconductor chip 120, and may fill at least a portion of the recessed portion 110H. Also, in the exemplary embodiment, the encapsulant 130 may fill at least a portion of the through-hole 115H. A material of the encapsulant 130 may not be limited to any particular material. For example, a material of the encapsulant 130 may be an insulating material, and the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), such as prepreg, ajinomoto build-up film (ABF), FR-4, bismaleimidetriazine (BT), or the like. If desired, a photoimageable encapsulant (PIE) resin may also be used.

A surface of the uppermost wiring layer 112d in contact with the interconnect structure 140 among the plurality of wiring layers 112a, 112b, 112c, and 112d, a surface of the encapsulant 130 in contact with the interconnect structure 140, and the active surface of the semiconductor chip 120 in contact with the interconnect structure 140 may be coplanar with one another. Thus, the interconnect structure 140 may be formed on such surfaces coplanar with one another without a separate grinding process.

The connection member 140 may redistribute the connection pads 122 of the semiconductor chip 120, and may electrically connect the wiring layers 112a, 112b, 112c, and 112d of the frame 110 to the connection pads 122 of the semiconductor chip 120. Several to several hundreds of connection pads 122 having a variety of functions may be redistributed through the connection member 140, and may be physically and/or electrically connected to an external entity through the electrical interconnect structure 170 in accordance with the respective functions. The interconnect structure 140 may include the insulating layer 141 disposed on the above described surfaces coplanar with one another, the redistribution layer 142 disposed on the insulating layer 141, and the connection via 143 penetrating through the insulating layer 141 and connecting the redistribution layer 142 to the uppermost wiring layer 112d and the connection pad 122. Similarly, the insulating layer 141, the redistribution layer 142, and the connection via 143 may be further disposed repeatedly.

A material of the insulating layer 141 may be an insulating material, and the insulating material may be a photosensitive insulating material such as a PID resin other than the insulating materials described above. In other words, the insulating layer 141 may be photosensitive insulating layer. When the insulating layer is photosensitive, the insulating layer 141 may have a significantly reduced thickness, and may easily implement a fine pitch of a connection via 143. The insulating layer 141 may be a photosensitive insulating layer including an insulating resin and an inorganic filler. When insulating layer 141 has multiple layers, the materials of the layers may be the same, or may be different if desired.

The redistribution layer 142 may substantially redistribute the connection pads 122, and a material of the redistribution layer 142 may be a metal material such as copper (Cu), aluminum (Al), silver (Ag), tin (Sn), gold (Au), nickel (Ni), lead (Pb), titanium (Ti), or alloys thereof, and the like. The redistribution layer 142 may perform a variety of functions depending on a design of the respective layers. For example, the redistribution layer 142 may include a ground (GND) pattern, a power (PWR) pattern, a signal (S) pattern, and the like, The signal (S) pattern may include various signals other than the ground (GND) patterns, the power (PWR) patterns, and the like, such as data signals, and the like. The redistribution layer 142 may also include various pad patterns.

The connection via 143 may electrically connect the redistribution layer 142, the fourth wiring layer 112d and the connection pad 122, and the like, formed in different layers, to one another, and may accordingly form an electrical path in the package 100A. The connection via 143 may function as a via for a signal, a via for a ground, a via for a power, and the like. A material of the connection via 143 may be a metal material such as copper (Cu), aluminum (Al), silver (Ag), tin (Sn), gold (Au), nickel (Ni), lead (Pb), titanium (Ti), or alloys thereof, and the like. The connection via 143 may be a filled type filled with a metal material, or may be a conformal type in which a metal material is formed along a wall of a via hole. The connection via 143 may have a cross-section having a tapered shape, or the like. The connection via 143 connecting the fourth wiring layer 112d and the redistribution layer 142, and the connection via 143 connecting the connection pad 122 and the redistribution layer 142 may have substantially the same height. In other words, the insulating layer 141 may be formed on the above described surfaces coplanar with one another, and thus, the connection vias 143 formed on the same level on the insulating layer 141 may have substantially the same height. When the semiconductor chip 120 is a bare die, the connection via 143 may be physically in contact with the connection pad 122.

A first passivation layer 151 may be an additional element, and may protect the interconnect structure 140 from external physical and chemical damages, and the like. The first passivation layer 151 may be disposed on the interconnect structure 140. The interconnect structure 140 may have an opening 151h configured to open at least a portion of the uppermost redistribution layer 142 of the interconnect structure 140. The opening 151h may be provided as several tens to several hundreds of openings 151h on the first passivation layer 151. A material of the first passivation layer 151 may not be limited to any particular material. For example, an insulating material may be used, and the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), such as prepreg, ajinomoto build-up film (ABF), FR-4, bismaleimide triazine (BT), or the like, for example, or a solder resist may be used.

A second passivation layer 152 may be an additional element, and may protect the interconnect structure 140 from external physical and chemical damages, and the like. The second passivation layer 152 may be disposed in a position opposing a portion in which the interconnect structure 140 of the frame 110 is disposed. The second passivation layer 152 may have an opening 152h configured to open at least a portion of the lowermost wiring layer 112c of the frame 110. The opening 152h may be provided as several tens to several hundreds of openings 152h on the second passivation layer 152. A material of the second passivation layer 152 may not be limited to any particular material. For example, an insulating material may be used, and the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), such as prepreg, ajinomoto build-up film (ABF), FR-4, bismaleimide triazine (BT), or the like, for example, or a solder resist may be used. When the second passivation layer 152 is provided, the through-hole 115H may also penetrate through the second passivation layer 152, and a region of the through-hole 115H penetrating through the second passivation layer 152 may have at least a portion filled with the encapsulant 130.

An under bump metal layer 160 may be an additional element, and may improve connection reliability of an electrical interconnect structure 170, thereby improving board level reliability of the package 100A. The under bump metal layer 160 may be connected to the uppermost redistribution layer 142c of the interconnect structure 140 opened through the opening 151h of the first passivation layer 151. The under bump metal layer 160 may be formed by a metallization method using a well-known metal material, but an example of the method is not limited thereto.

The electrical interconnect structure 170 may be an additional element, and may physically and/or electrically connect the fan-out semiconductor package 100A to an external entity. For example, the fan-out semiconductor package 100A may be mounted on a mainboard of an electronic device through the electrical interconnect structure 170. The electrical interconnect structure 170 may be formed of a metal having a low melting point, a material including tin (Sn), for example, such as a solder, but a material of the electrical interconnect structure 170 is not limited thereto. The electrical interconnect structure 170 may be a land, a ball, a pin, and the like. The electrical interconnect structure 170 may be formed of multiple layers or a single layer. When the electrical interconnect structure 170 is formed of multiple layers, the electrical interconnect structure 170 may include a copper (Cu) pillar or a solder, and when the electrical interconnect structure 170 is formed of a single layer, the electrical interconnect structure 170 may include a tin-silver solder or copper (Cu). However, an example of the electrical interconnect structure 170 may not be limited thereto.

The number, a size of a gap, an arrangement form, and the like, of the electrical interconnect structure 170 may not be limited to any particular examples, and may vary depending on a design. For example, the number of the electrical interconnect structures 170 may be several tens or several thousands depending on the number of the connection pads 122, or may be higher or lower than several tens or several thousands. When the electrical interconnect structures 170 is a solder ball, the electrical interconnect structures 170 may cover a side surface extending onto one surface of the first passivation layer 151 of the under bump metal layer 160, and connection reliability may accordingly improve.

At least one of the electrical interconnect structures 170 may be disposed in a fan-out region. The fan-out region may be a region beyond a region in which the semiconductor chip 120 is disposed. The fan-out package may have improved reliability as compared to a fan-in package, may implement a plurality of I/O terminals, and a 3D interconnection may be easily implemented. Also, the fan-out package may have a significantly reduced thickness, and may be cost-competitive, as compared to a ball grid array (BGA) package, a land grid array (LGA) package, and the like.

Although not illustrated, if desired, a metal thin film may be formed on a wall of the recessed portion 110H in order to radiate heat and/or to shield electromagnetic waves. Also, if desired, a plurality of the semiconductor chips 120 performing the same function or different functions may be disposed in the recessed portion 110H. Further, if desired, a separate passive component, such as an inductor, a capacitor, or the like, may be disposed in the recessed portion 110H. Also, if desired, a surface mount technology (SMT) component including a passive component such as an inductor, a capacitor, or the like, may be disposed on surfaces of the first and second passivation layers 151 and 152, for example.

Figure 11:
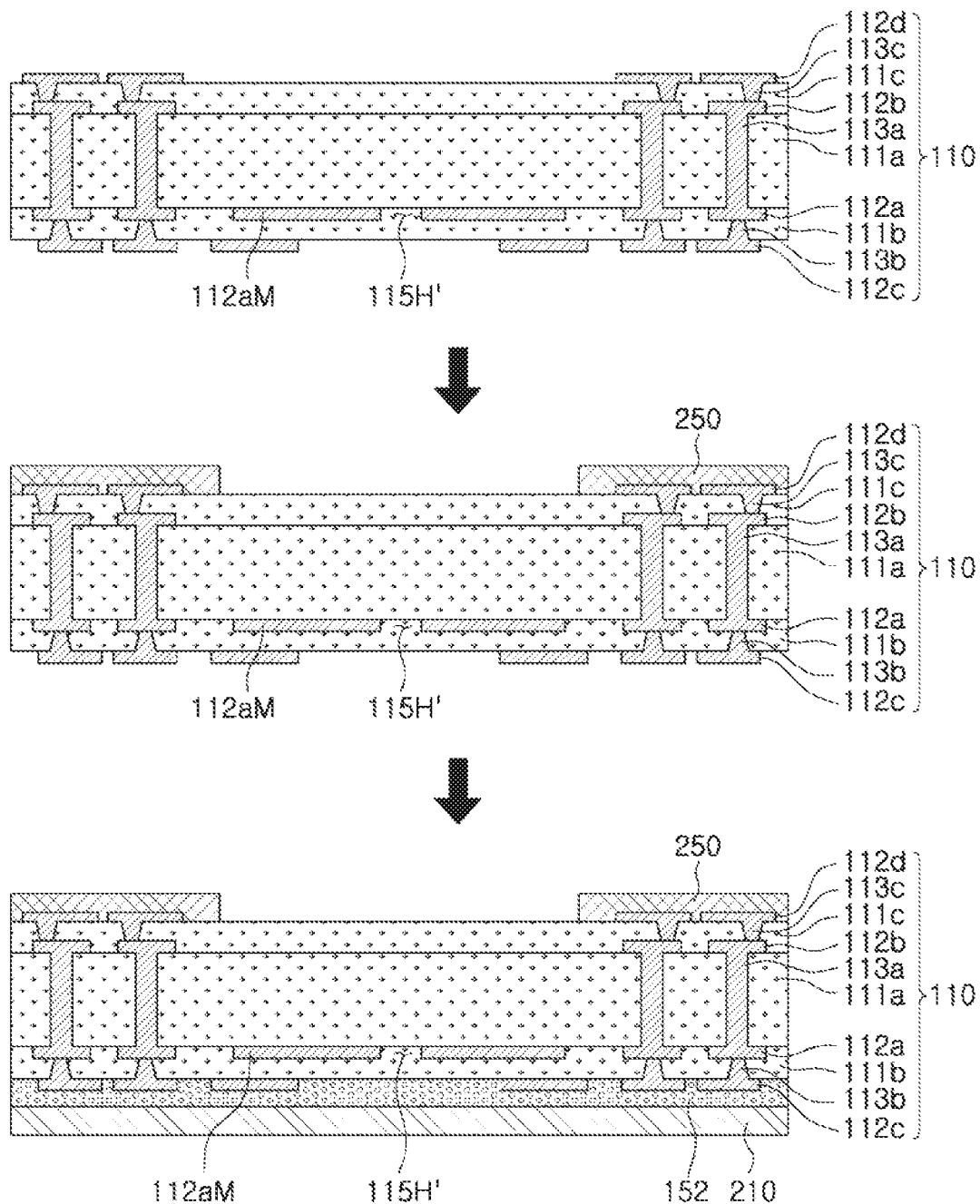
FIGS. 11 to 13 are diagrams illustrating processes of manufacturing a fan-out semiconductor package in FIG. 9.
Figure 12:
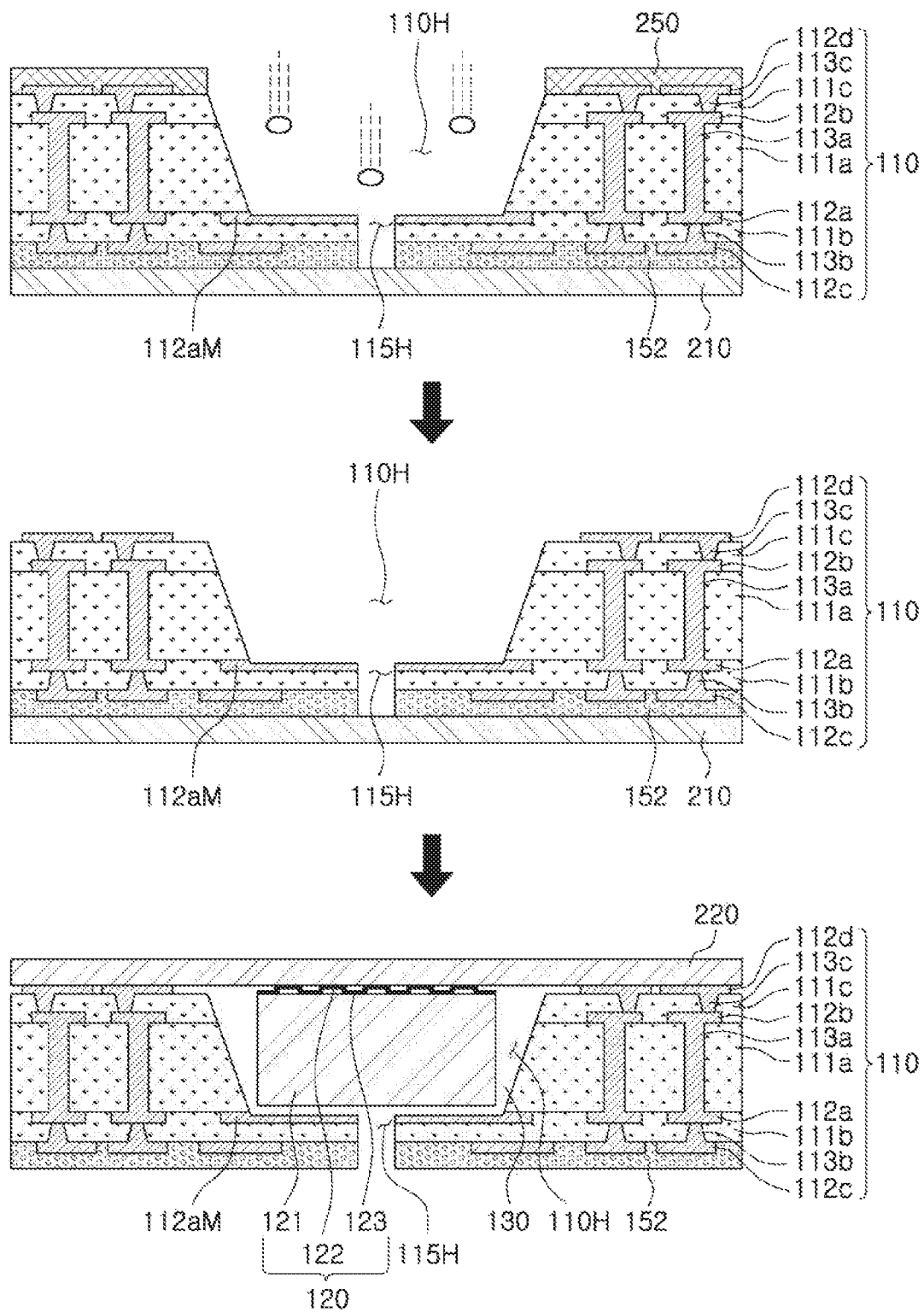
Figure 13:
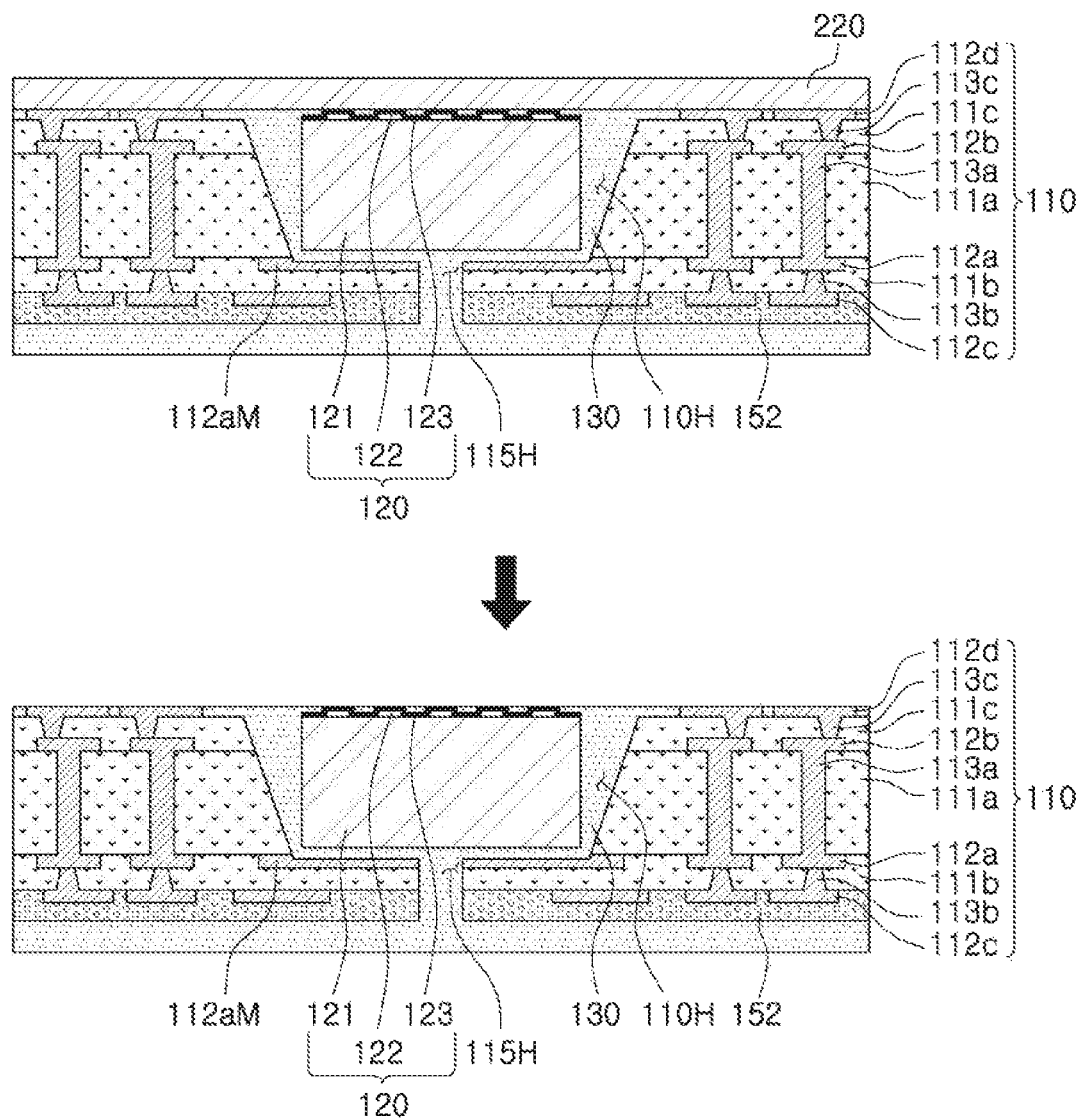

FIGS. 11 to 13 are diagrams illustrating processes of manufacturing a fan-out semiconductor package in FIG. 9.

Referring to FIG. 11, a frame 110 may be prepared. A preliminary through-hole 115H' may be formed on a stopper layer 112aM in advance. The frame 110 may be prepared such that a core insulating layer 111a may be prepared using a copper clad laminate (CCL), first and second wiring layers 112a and 112b, the stopper layer 112aM, and a first connection via layer 113a may be formed on the core insulating layer 111a using a well-known plating process, first and second built-up insulating layers 111b and 111c may be formed on both surfaces of the core insulating layer 111a, the first and second built-up insulating layers 111b and 111c may be formed by laminating prepreg or ABF and performing a curing process, and third and fourth wiring layers 112c and 112d and second and third connection via layers 113b and 113c may be formed on the first and second built-up insulating layers 111b and 111c using a well-known plating process. A dry film 250 covering the fourth wiring layer 112d may be attached onto the frame 110 prepared through a series of processes. A carrier 210 on which a second passivation layer 152 is formed may be attached to a lower portion of the frame 110 such that the third wiring layer 112c is buried in the second passivation layer 152. The carrier 210 may include a core layer (not illustrated), a metal layer (not illustrated), a release layer (not illustrated), a metal layer (not illustrated) layered in order.

Referring to FIG. 12, a recessed portion 110H penetrating through the core insulating layer 111a and the second built-up insulating layer 111c may be formed using a sand blast, or the like. The stopper layer 112aM may function as a stopper in the sand blasting process. Portions of the first built-up insulating layer 111b and the second passivation layer 152 exposed by the stopper layer 112aM may be sand blasted when the sand blast process continues and may be removed by the sand blast process. Accordingly, the first built-up insulating layer 111b and the second passivation layer 152 may be penetrated by the preliminary through-hole 115H' formed in the stopper layer 112aM, and a through-hole 115H may be formed. In this case, the metal layer (not illustrated) of the carrier 210 may function as a stopper. The dry film 250 may be removed. The semiconductor chip 120 may be disposed in the recessed portion 110H while the active surface of the semiconductor chip 120 is attached to the tape 220. As the semiconductor chip 120 is attached to the tape 220, the inactive surface may be spaced apart from the stopper layer 112aM. The tape 220 may also be attached to an uppermost wiring layer 112d of the frame 110. The carrier 210 may be separated. After the carrier 210 is separated, the metal layer (not illustrated) may remain on a lower surface of the second passivation layer 152.

Referring to FIG. 13, the semiconductor chip 120 may be encapsulated by injecting the encapsulant 130 through the through-hole 115H, and also through a gap between the inactive surface of the semiconductor chip 120 and the stopper layer 112aM. The tape 220 may be separated. If desired, the encapsulant 130 covering a lower surface of the second passivation layer 152 may be removed by performing a grinding process, and the like, and when the interconnect structure 140, the first passivation layer 151, the under bump metal layer 160, and the electrical interconnect structure 170 are formed, the fan-out semiconductor package 100A may be manufactured. The interconnect structure 140 may be formed by repeatedly performing processes of forming the insulating layer 141 by applying a PID, forming a photovia, and forming the redistribution layer 142 and the connection via 143. The first passivation layer 151 may be formed by laminating a precursor thereof, and performing a curing process or performing a curing process after an applying process, the under bump metal layer 160 may be formed by a metallization process, and the electrical interconnect structure 170 may be formed through a reflow process after applying a solder, and the like.

The descriptions of the other elements may be the same as the descriptions described with reference to FIGS. 9 and 10, and thus, the detailed descriptions thereof will not be repeated.

Figure 14:
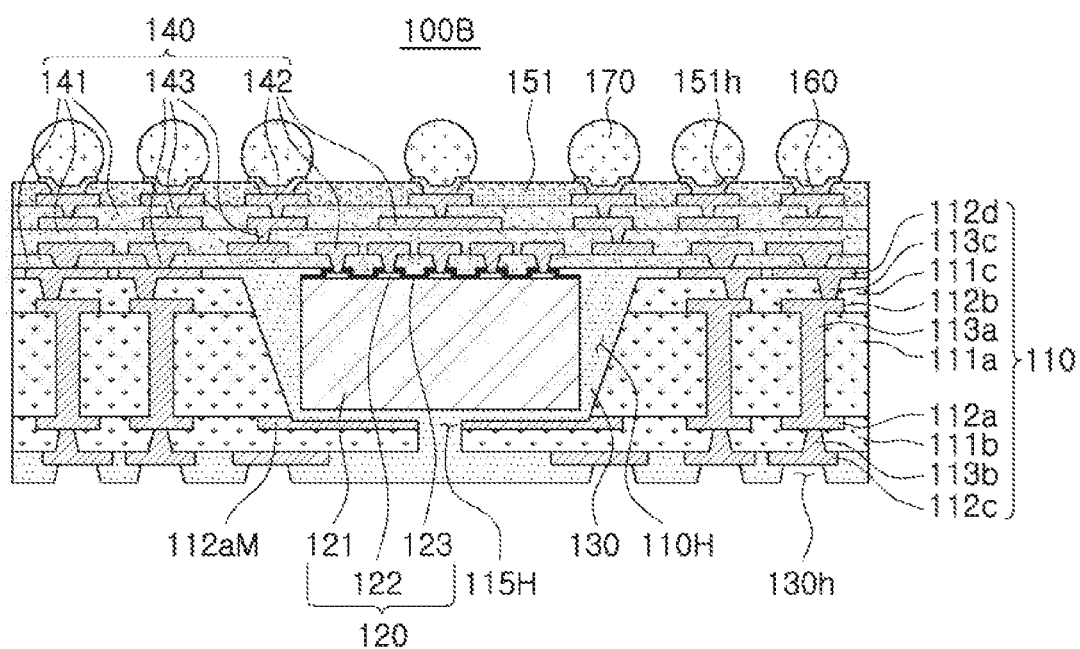
FIG. 14 is a schematic cross-sectional diagram illustrating another example of a fan-out semiconductor package.

FIG. 14 is a schematic cross-sectional diagram illustrating another example of a fan-out semiconductor package.

Referring to the diagram, in a fan-out semiconductor package 100B according to another exemplary embodiment, a second passivation layer 152 may not be provided, and instead, an encapsulant 130 may be disposed in a lower portion opposing a portion in which the interconnect structure 140 of a frame 110 is disposed and cover the frame 110, as compared to the fan-out semiconductor package 100A. In other words, the encapsulant 130 may extend from the through-hole 115H to a lower portion of the frame 110. In this case, a process of grinding the encapsulant 130 in a lower portion of the frame 110 may be omitted, and a process of layering a carrier 210 described above may also be omitted. The encapsulant 130 may cover a third wiring layer 112c, a lowermost wiring layer, and may have an opening 130h configured to open at least a portion of the third wiring layer 112c.

The descriptions of the other elements may be the same as the descriptions described with reference to FIGS. 9 to 13, and thus, the detailed descriptions thereof will not be repeated.

Figure 15:
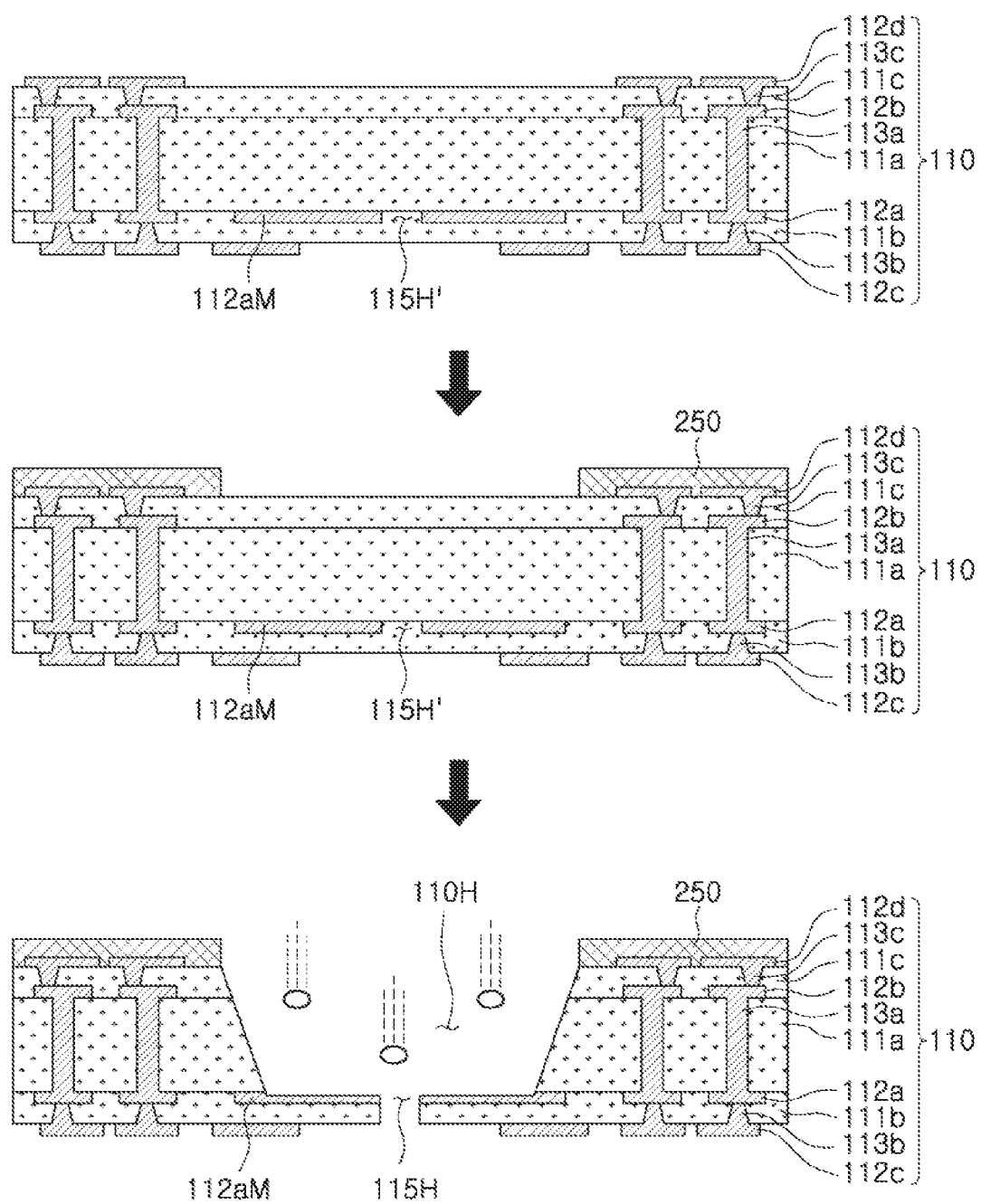
FIGS. 15 and 16 are schematic diagrams illustrating a process of manufacturing a fan-out semiconductor package in FIG. 14.
Figure 16:
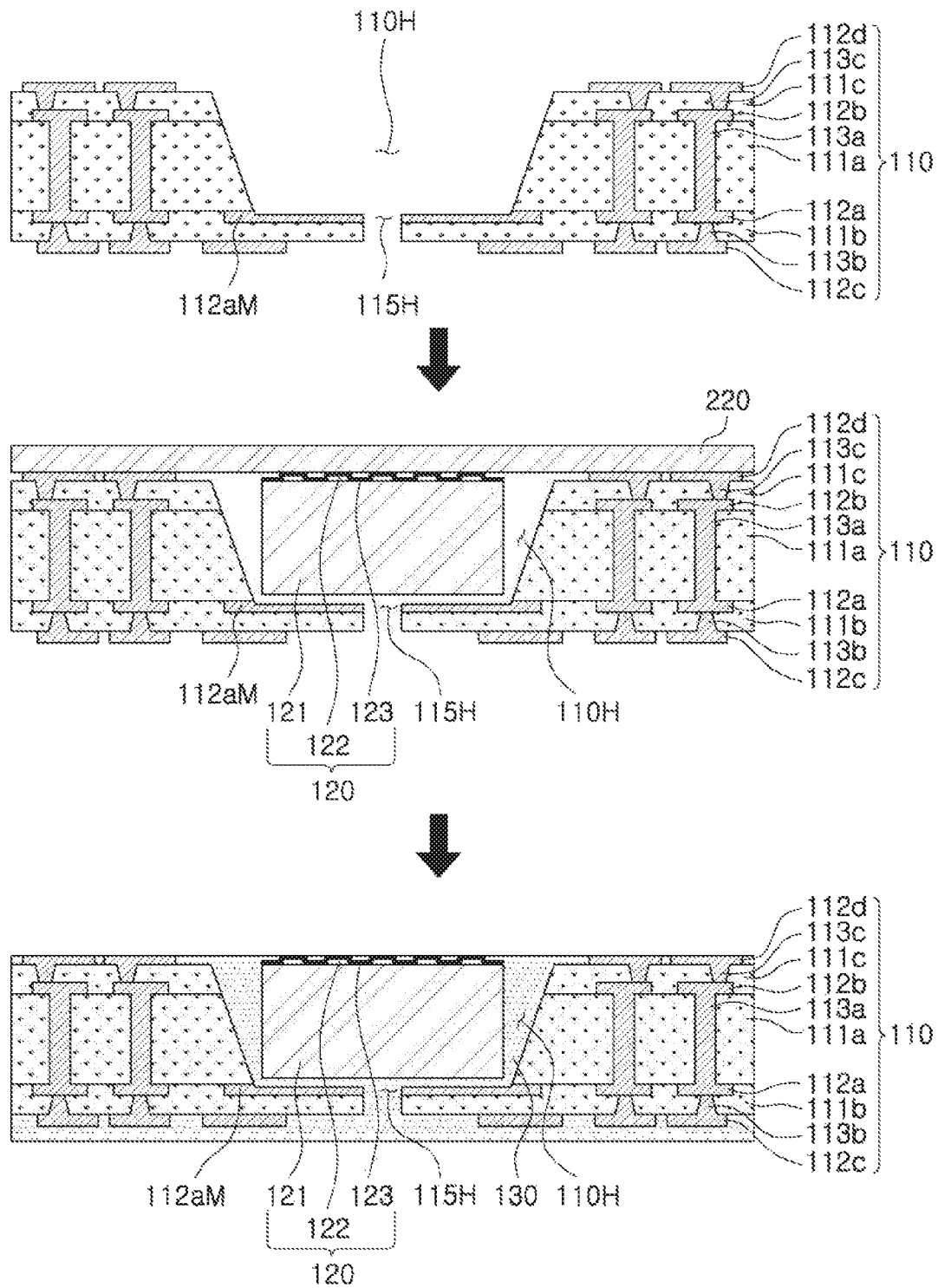

FIGS. 15 and 16 are schematic diagrams illustrating a process of manufacturing a fan-out semiconductor package in FIG. 14.

Referring to FIG. 15, a frame 110 may be prepared. A preliminary through-hole 115H' may be formed on a stopper layer 112aM in advance. A dry film 250 covering a fourth wiring layer 112d may be attached onto the frame 110. A recessed portion 110H penetrating through a core insulating layer 111a and a second built-up insulating layer 111c may be formed using a sand blast. In this case, the stopper layer 112aM may function as a stopper. Also, a first built-up insulating layer 111b may be penetrated by the preliminary through-hole 115H' formed on the stopper layer 112aM, and a through-hole 115H may be formed accordingly.

Referring to FIG. 16, the dry film 250 may be removed. The semiconductor chip 120 may be disposed on the recessed portion 110H while an active surface of the semiconductor chip 120 is attached to a tape 220. As the semiconductor chip 120 is attached to the tape 220, the inactive surface may be spaced apart from the stopper layer 112aM. The tape 220 may be attached to an uppermost wiring layer 112d of the frame 110. The semiconductor chip 120 may be encapsulated by injecting the encapsulant 130 through the through-hole 115H and also through a gap between the inactive surface of the semiconductor chip 120 and the stopper layer 112aM. The encapsulant 130 may be formed to cover a lower portion of the frame 110, that is, to bury a third wiring layer 112c. The tape 220 may be separated. The interconnect structure 140, a first passivation layer 151, an under bump metal layer 160, and an electrical interconnect structure 170 may be formed, and an opening 130h may be formed, and a fan-out semiconductor package 100B according to the exemplary embodiment may be manufactured.

The descriptions of the other elements may be the same as the descriptions described with reference to FIGS. 9 to 14, and thus, the detailed descriptions thereof will not be repeated.

Figure 17:
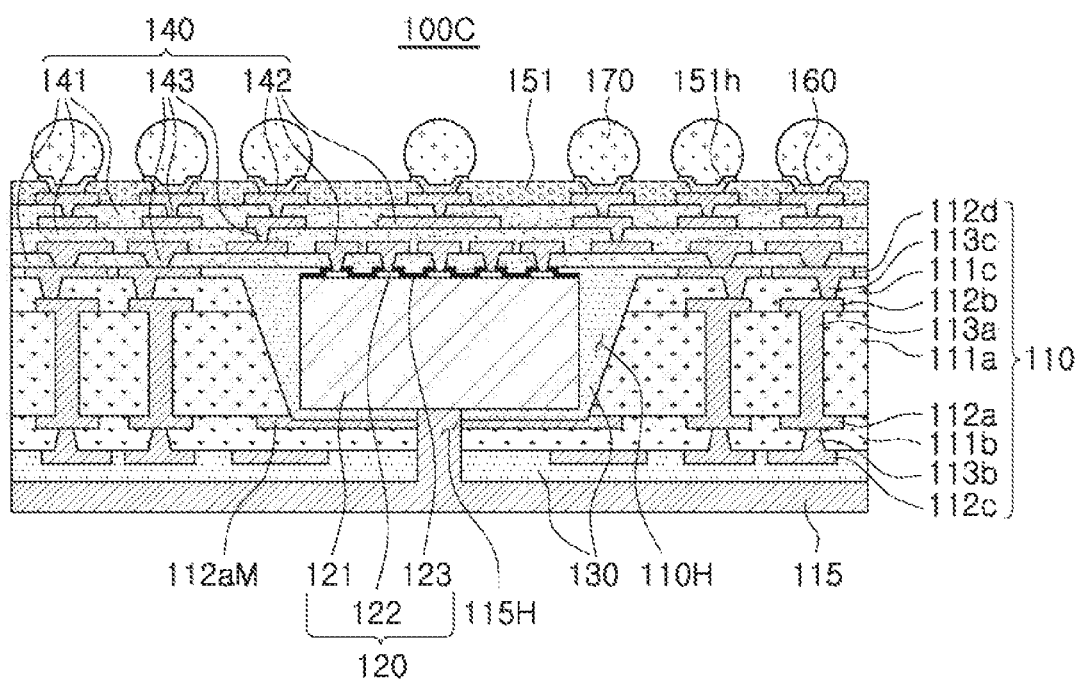
FIG. 17 is a schematic cross-sectional diagram illustrating another example of a fan-out semiconductor package.

FIG. 17 is a schematic cross-sectional diagram illustrating another example of a fan-out semiconductor package.

Referring to the diagram, in a fan-out semiconductor package 100C according to another exemplary embodiment, a through-hole 115H may have at least a portion filled with a metal material rather than an encapsulant 130, and a metal layer 115 may be formed accordingly. The metal layer may include a metal material such as copper (Cu), aluminum (Al), silver (Ag), tin (Sn), gold (Au), nickel (Ni), lead (Pb), titanium (Ti), or alloys thereof. The through-hole 115H may extend to penetrate through an encapsulant 130 between an inactive surface of a semiconductor chip 120 and a stopper layer 112aM and may open the inactive surface of the semiconductor chip 120, and at least a portion of a region penetrating through the encapsulant 130 between the inactive surface of the semiconductor chip 120 and the stopper layer 112aM may be filled with the metal layer 115, a metal material. As a result, the metal layer 115 may be physically in contact with the inactive surface of the semiconductor chip 120. The encapsulant 130 may be disposed in a lower portion opposing a portion in which an interconnect structure 140 of a frame 110 is disposed, and may cover the frame 110, and the metal layer 115, a metal material, may extend from the through-hole 115H to cover a region of the encapsulant 130 covering the lower portion opposing the portion in which the interconnect structure 140 of the frame 110 is disposed. As described above, the metal layer 115 may be formed as the through-hole 115H is filled with a metal material, and if desired, the metal layer 115 may further extend, thereby implementing an improved heat radiating effect and an improved microwave shielding effect.

The descriptions of the other elements may be the same as the descriptions described with reference to FIGS. 9 to 16, and thus, the detailed descriptions thereof will not be repeated.

Figure 18:
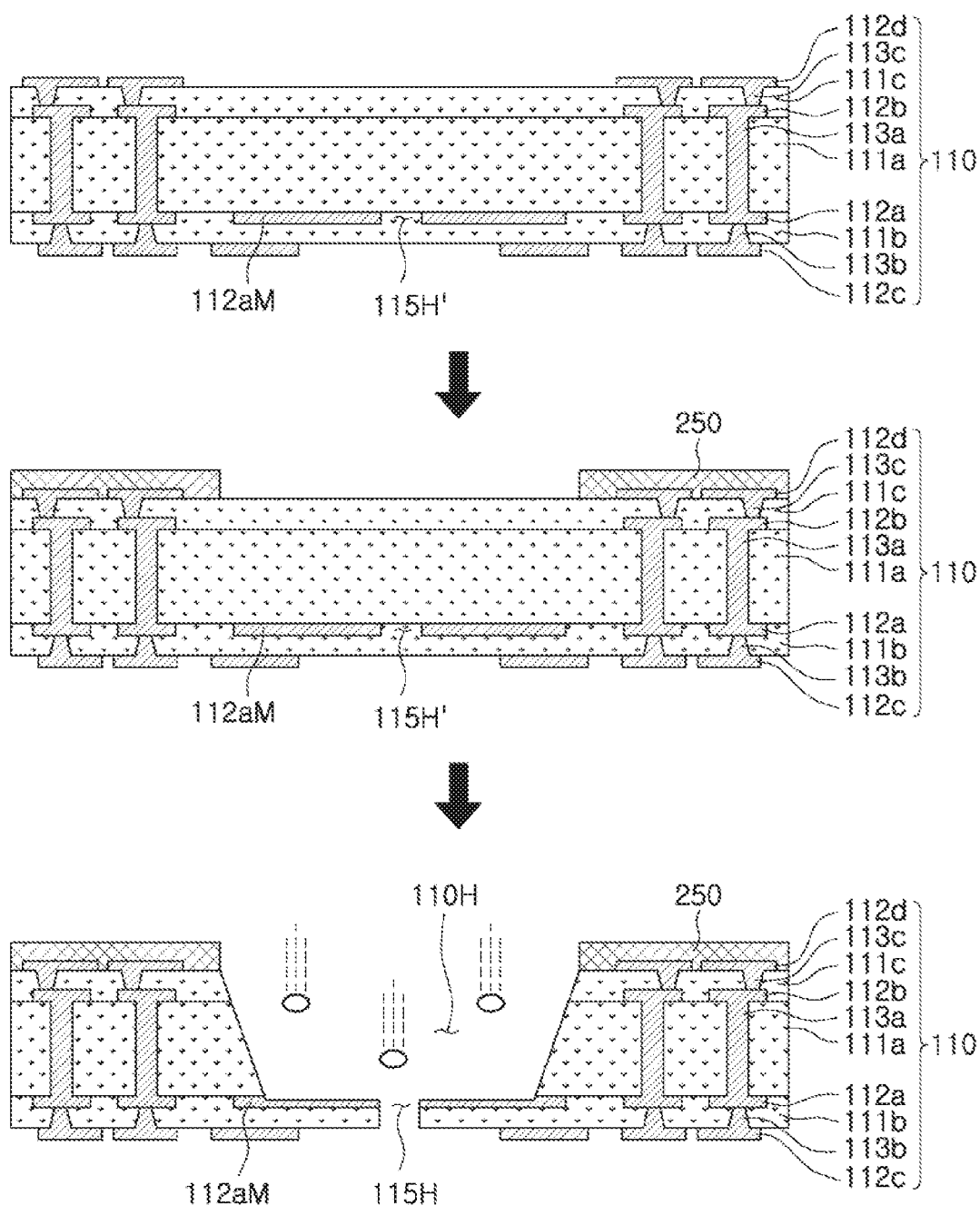
FIGS. 18 to 20 are schematic diagrams illustrating processes of manufacturing a fan-out semiconductor package in FIG. 17.
Figure 19:
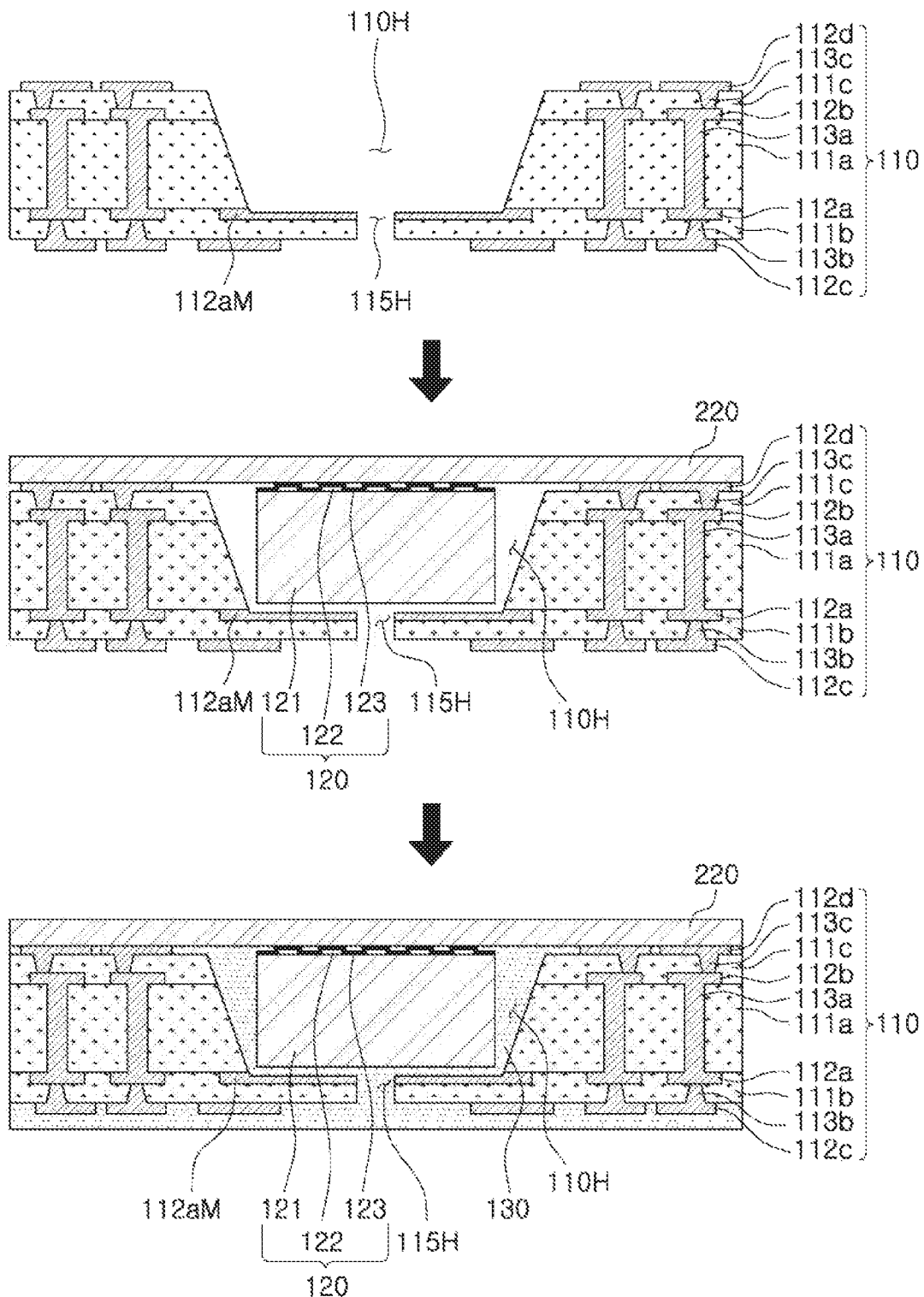
Figure 20:
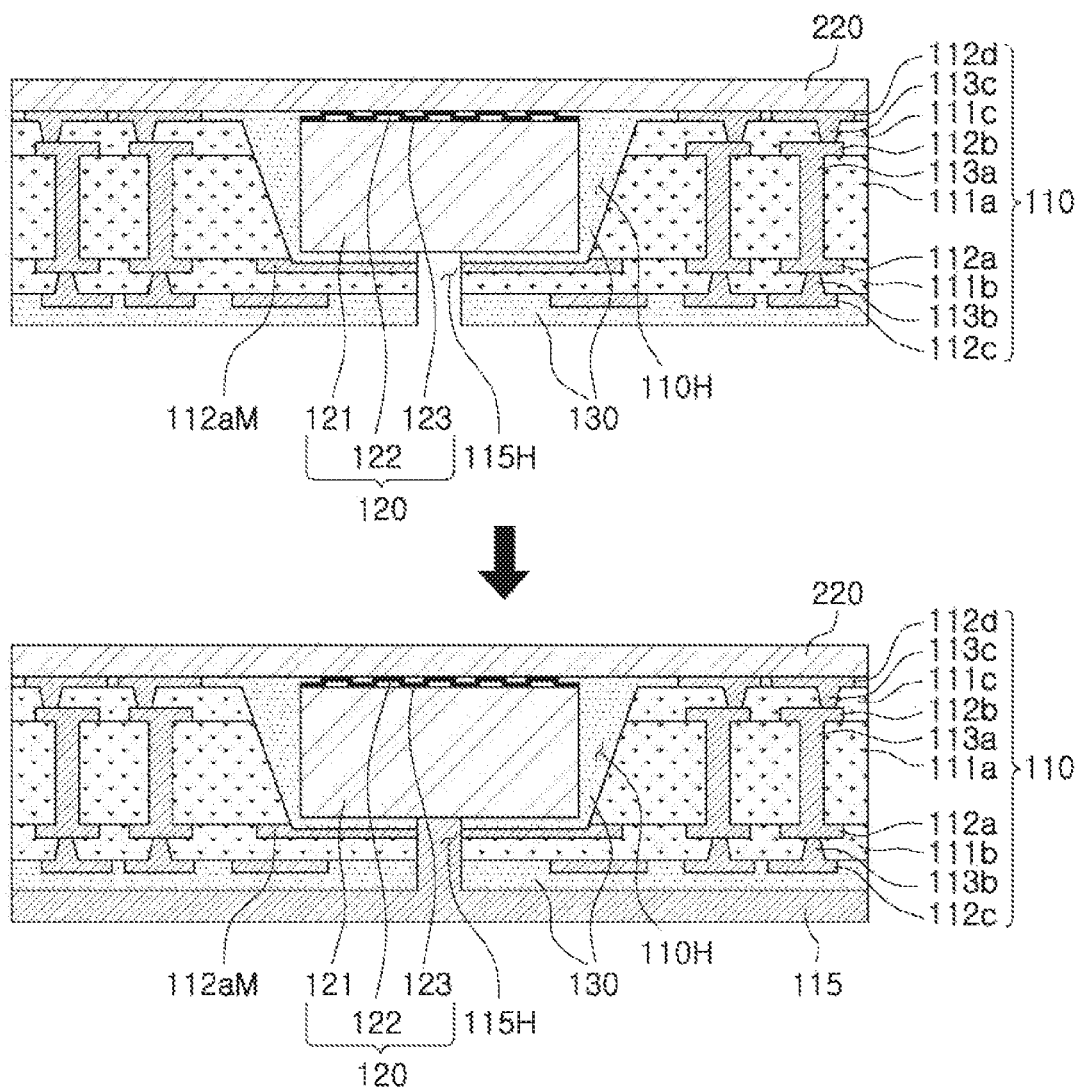

FIGS. 18 to 20 are schematic diagrams illustrating processes of manufacturing a fan-out semiconductor package in FIG. 17.

Referring to FIG. 18, a frame 110 may be prepared, and a preliminary through-hole 115H' may be formed on a stopper layer 112aM in advance. A dry film 250 covering a fourth wiring layer 112d may be attached onto the frame 110. A recessed portion 110H penetrating through a core insulating layer 111a and a second built-up insulating layer 111c may be formed using a sand blast. In this case, the stopper layer 112aM may function as a stopper. Also, a first built-up insulating layer 111b may be penetrated by the preliminary through-hole 115H' formed on the stopper layer 112aM, and a through-hole 115H may be formed accordingly.

Referring to FIG. 19, the dry film 250 may be removed. The semiconductor chip 120 may be disposed in the recessed portion 110H while an active surface of the semiconductor chip 120 is attached to a tape 220. As the semiconductor chip 120 is attached to the tape 220, the inactive surface may be spaced apart from the stopper layer 112aM. The tape 220 may be attached to an uppermost wiring layer 112d of the frame 110. The semiconductor chip 120 may be encapsulated by injecting the encapsulant 130 through the through-hole 115H and also through a gap between the inactive surface of the semiconductor chip 120 and the stopper layer 112aM. The encapsulant 130 may be formed to cover a lower portion of the frame, that is, to bury a third wiring layer 112c.

Referring to FIG. 20, the through-hole 115H may extend by processing the encapsulant 130 in a lower portion of the inactive surface of the semiconductor chip 120. The extended through-hole 115H may open the inactive surface of the semiconductor chip 120. If the encapsulant 130 includes a PIE, the encapsulant 130 may be processed more easily through exposure and development. A seed layer such as a titanium (Ti) layer or a copper (Cu) may be formed on a lower surface of the inactive surface opened by a stopper, a wall of the recessed portion 110H, and a lower portion of the encapsulant 130, a plating layer may be formed on the seed layer using a copper (Cu) electroplating process, or the like, and a metal layer 115 may be formed. The tape 220 may be separated. An interconnect structure 140, a first passivation layer 151, an under bump metal layer 160, and an electrical interconnect structure 170 may be formed, and a fan-out semiconductor package 100C may be manufactured.

The descriptions of the other elements may be the same as the descriptions described with reference to FIGS. 9 to 17, and thus, the detailed descriptions thereof will not be repeated.

According to the aforementioned exemplary embodiments, the fan-out semiconductor package configured such that the semiconductor chip may be disposed using a frame including a recessed portion having a blind form such that a process of forming a metal post and a process of grinding a metal post may be omitted may be provided.

In the exemplary embodiments, the expression "coplanar" may indicate that elements may be positioned on the exact same level, but may also indicate that elements may be substantially positioned on the same level as a result of a grinding process, and the like.

In the exemplary embodiments, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The terms may be defined as above for ease of description, and the scope of right of the exemplary embodiments is not particularly limited to the above terms.

In the exemplary embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the exemplary embodiments.

In the exemplary embodiments, the term "exemplary embodiment" may not refer to one same exemplary embodiment, but may be provided to describe and emphasize different unique features of each exemplary embodiment. The above suggested exemplary embodiments may be implemented do not exclude the possibilities of combination with features of other exemplary embodiments. For example, even though the features described in one exemplary embodiment are not described in the other exemplary embodiment, the description may be understood as relevant to the other exemplary embodiment unless otherwise indicated.

The terms used in the exemplary embodiments are used to simply describe an exemplary embodiment, and are not intended to limit the present disclosure. A singular term includes a plural form unless otherwise indicated.

While the exemplary embodiments have been shown and described above, it will be apparent to those skilled in the art that modifications and variations could be made without departing from the scope of the present invention as defined by the appended claims.

What is claimed is:

1. A fan-out semiconductor package, comprising:
a frame comprising a plurality of wiring layers electrically connected to one another, and having a recessed portion having a stopper layer disposed on a bottom surface of the recessed portion, and a through-hole penetrating through the stopper layer;
a semiconductor chip having an active surface on which a connection pad is disposed and an inactive surface opposing the active surface, and disposed in the recessed portion such that the inactive surface opposes the stopper layer;
an encapsulant covering at least portions of the frame and the inactive surface of the semiconductor chip, and filling at least a portion of the recessed portion; and
an interconnect structure disposed on the frame and the active surface of the semiconductor chip, and comprising a redistribution layer electrically connected to the plurality of wiring layers and the connection pad.

2. The fan-out semiconductor package of claim 1, wherein the inactive surface is spaced apart from the stopper layer by a predetermined distance.

3. The fan-out semiconductor package of claim 2, wherein the encapsulant fills a space, defined by the predetermined distance, between the stopper layer and the inactive surface.

4. The fan-out semiconductor package of claim 1, wherein a surface of a wiring layer being in contact with the interconnect structure among the plurality of wiring layers, a surface of the encapsulant being in contact with the interconnect structure, and the active surface of the semiconductor chip being in contact with the interconnect structure are coplanar with one another on a coplanar surface.

5. The fan-out semiconductor package of claim 4, wherein the interconnect structure comprises an insulating layer disposed on the coplanar surface, the redistribution layer disposed on the insulating layer, a first connection via penetrating through the insulating layer and electrically connecting the redistribution layer to the plurality of wiring layers, and a second connection via penetrating through the insulating layer and electrically connecting the redistribution layer to the connection pad, and the first and second connection vias have the same heights.

6. The fan-out semiconductor package of claim 5, wherein the connection pad is physically in contact with the second connection via.

7. The fan-out semiconductor package of claim 1,
wherein the frame comprises a core insulating layer, a first built-up insulating layer having one or more layers, disposed on one portion of the core insulating layer, and covering the stopper layer, and a second built-up insulating layer having one or more layers and disposed on the other portion of the core insulating layer,
wherein the through-hole penetrates through the first built-up insulating layer, and the core insulating layer has a thickness greater than thicknesses of the first and second built-up insulating layers.

8. The fan-out semiconductor package of claim 7,
wherein the frame further comprises a first connection via layer penetrating through the core insulating layer, a second connection via layer having one or more layers and respectively penetrating through the first built-up insulating layer having one or more layers, and a third connection via layer having one or more layers and respectively penetrating through the second built-up insulating layer having one or more layers,
wherein the plurality of wiring layers are electrically connected to one another through the first to third connection via layers, and connection vias of the second connection via layer and connection vias of the third connection via layer are tapered in opposing directions.

9. The fan-out semiconductor package of claim 1, wherein the through-hole has at least a portion filled with the encapsulant.

10. The fan-out semiconductor package of claim 9, further comprising:
a passivation layer disposed in a position opposing a position in which the interconnect structure of the frame is disposed,
wherein the through-hole extends to penetrate through the passivation layer, and a region of the through-hole penetrating through the passivation layer has at least a portion filled with the encapsulant.

11. The fan-out semiconductor package of claim 9, wherein the encapsulant extends from the through-hole to cover a portion opposing a position in which the interconnect structure of the frame is disposed.

12. The fan-out semiconductor package of claim 1, wherein the through-hole has at least a portion filled with a metal material.

13. The fan-out semiconductor package of claim 12, wherein the through-hole extends to penetrate through an encapsulant between the inactive surface of the semiconductor chip and the stopper layer such that the inactive surface of the semiconductor chip is opened, a region of the through-hole penetrating through the encapsulant between the inactive surface of the semiconductor chip and the stopper layer has at least a portion filled with the metal material, and the metal material is physically in contact with the inactive surface of the semiconductor chip.

14. The fan-out semiconductor package of claim 12, wherein the encapsulant covers a portion opposing a position in which the interconnect structure of the frame is disposed, and the metal material extends from the through-hole to cover a region of the encapsulant covering the portion opposing the position in which the interconnect structure of the frame is disposed.

15. The fan-out semiconductor package of claim 1, wherein the recessed portion has a sloped wall.

16. The fan-out semiconductor package of claim 1, wherein the stopper layer is a metal layer.

17. The fan-out semiconductor package of claim 1, wherein at least one layer of the plurality of wiring layers is disposed in a position lower than the stopper layer.

* * * * *